United States Patent
Griffin et al.

(10) Patent No.: US 11,595,759 B2
(45) Date of Patent: Feb. 28, 2023

(54) ENERGY HARVESTING CIRCUIT COMPRISING AN ACTIVE RECTIFIER

(71) Applicant: The Boeing Company, Chicago, IL (US)

(72) Inventors: Steven F. Griffin, Kihei, HI (US); Daryn D. Kono, Pukalani, HI (US); Timothy John Paulitz, Renton, WA (US); James Benjamin Turner, Monroe, WA (US)

(73) Assignee: THE BOEING COMPANY, Chicago, IL (US)

( * ) Notice: Subject to any disclaimer, the term of this patent is extended or adjusted under 35 U.S.C. 154(b) by 399 days.

(21) Appl. No.: 16/849,237

(22) Filed: Apr. 15, 2020

(65) Prior Publication Data

US 2021/0329384 A1    Oct. 21, 2021

(51) Int. Cl.
*H02N 2/18* (2006.01)
*H04R 9/02* (2006.01)
*H01L 41/04* (2006.01)
*H02M 7/217* (2006.01)

(52) U.S. Cl.
CPC ............ *H04R 9/02* (2013.01); *H01L 41/042* (2013.01); *H02M 7/217* (2013.01); *H02N 2/181* (2013.01); *H04R 2209/00* (2013.01)

(58) Field of Classification Search
CPC ........ H04R 9/02; H04R 2209/00; H04R 3/00; H04R 9/08; H01L 41/042; H01L 41/1138; H02M 7/217; H02M 1/007; H02N 2/181
USPC .......................................................... 310/318
See application file for complete search history.

(56) References Cited

U.S. PATENT DOCUMENTS

| | | | | |
|---|---|---|---|---|
| 7,260,984 B2 * | 8/2007 | Roundy | ............... | B60C 23/0411 73/146.5 |
| 9,537,357 B2 * | 1/2017 | Leabman | ................... | H02J 7/02 |
| 2011/0057458 A1 * | 3/2011 | Lee | .......... | H01L 41/00 29/25.35 |
| 2020/0374013 A1 * | 11/2020 | Jang | ........................ | H04B 11/00 |

OTHER PUBLICATIONS

Khan and Shah, Hybrid acoustic energy harvesting using combined electromagnetic and piezoelectric conversion, Review of Scientific Instruments 87, 025003 (Feb. 19, 2016).

* cited by examiner

*Primary Examiner* — Richard Tan
(74) *Attorney, Agent, or Firm* — Vivacqua Crane, PLLC

(57) ABSTRACT

An energy harvesting circuit is disclosed and comprises one or more electrical loads that consume direct current (DC) power, a rectifier, and a hybrid acoustic absorber. The rectifier comprises one or more active switching elements that are driven by a gate drive voltage. The hybrid acoustic absorber comprises a diaphragm and a voice coil. The diaphragm is constructed at least in part of a piezoelectric material. The piezoelectric material is configured to generate a diaphragm voltage in response to sound waves deforming the diaphragm. The diaphragm voltage is at least equal to the gate drive voltage to drive the one or more active switching elements of the rectifier. The voice coil is attached to the diaphragm and configured to generate a voice coil voltage that is less than the gate drive voltage of the one or more active switching elements.

20 Claims, 8 Drawing Sheets

ENERGY HARVESTING CIRCUIT COMPRISING AN ACTIVE RECTIFIER

INTRODUCTION

The present disclosure relates to an energy harvesting circuit. More particularly, the present disclosure is directed towards an energy harvesting circuit comprising an active rectifier and a hybrid acoustic absorber.

BACKGROUND

A vibrating object creates sound waves that travel through a medium, such as air. Unwanted sound waves may be referred to as noise. Some examples of noise sources include, but are not limited to, jet engines for aircraft, high-speed trains, power plants, machines, and expressways. However, the acoustic energy generated by a noise source is usually dissipated throughout an environment, and thereby represents a lost energy resource. An energy harvesting device may be used to generate electrical energy from the vibrations that occur in objects created by the sound waves. One such type of energy harvesting device is a voice coil energy harvester.

A voice coil energy harvesting circuit typically comprises of a voice coil connected to a rectifier. The voice coil generates an alternating current (AC) output, and the rectifier converts the AC output into a direct current (DC) output. The rectifier employs passive elements such as, for example, standard and Schottky diodes. The AC output generated by the voice coil is relatively low. Consequently, the diodes of the rectifier are only used below a knee point along their respective current versus voltage characteristic curve. The knee point of a diode represents a sharp increase in current and is found within the first quadrant of the respective current versus voltage characteristic curve. One drawback is that appreciable power losses of harvested electrical energy may result when the diodes are used below the knee point.

SUMMARY

According to several aspects, an energy harvesting circuit is disclosed, and comprises one or more electrical loads that consume direct current (DC) power and a rectifier comprising one or more active switching elements. The one or more active switching elements are driven by a gate drive voltage. The energy harvesting circuit also comprises a hybrid acoustic absorber. The hybrid acoustic absorber comprises a diaphragm constructed at least in part of a piezoelectric material. The piezoelectric material is configured to generate a diaphragm voltage in response to sound waves deforming the diaphragm. The diaphragm voltage is at least equal to the gate drive voltage to drive the one or more active switching elements of the rectifier. The hybrid acoustic absorber also comprises a voice coil attached to the diaphragm that is configured to generate a voice coil voltage that is less than the gate drive voltage of the one or more active switching elements. The voice coil voltage comprises an alternating current (AC) output that is converted into a DC output by the rectifier. The voice coil voltage comprising the DC output is provided to the one or more electrical loads.

In another aspect, method for converting sound waves into electrical power by an energy harvesting circuit is disclosed. The method comprises impinging the sound waves against a diaphragm. The sound waves deform the diaphragm and the diaphragm is constructed at least in part of a piezoelectric material. In response to being deformed by the sound waves, the method comprises generating, by the piezoelectric material, a diaphragm voltage. The method further comprises driving one or more active switching elements that are part of a rectifier by the diaphragm voltage. The rectifier comprises one or more active switching elements, and the diaphragm voltage is at least equal to a gate drive voltage of the one or more active switching elements of the rectifier. The method comprises generating a voice coil voltage by a voice coil attached to the diaphragm. The voice coil voltage is less than the gate drive voltage of the one or more active switching elements of the rectifier. The method also comprises converting an AC output of the voice coil voltage into a DC output by the rectifier. Finally, the method comprises providing the voice coil voltage comprising the DC output to one or more electrical loads.

The features, functions, and advantages that have been discussed may be achieved independently in various embodiments or may be combined in other embodiments further details of which can be seen with reference to the following description and drawings.

BRIEF DESCRIPTION OF THE DRAWINGS

The drawings described herein are for illustration purposes only and are not intended to limit the scope of the present disclosure in any way.

DETAILED DESCRIPTION

The present disclosure is directed towards an energy harvesting circuit comprising a hybrid acoustic absorber and a rectifier electrically connected to the hybrid acoustic absorber. The rectifier is an active rectifier and comprises one or more active switching elements that are each driven by a respective gate drive voltage. The hybrid acoustic absorber comprises a diaphragm and a voice coil attached to the diaphragm. The diaphragm is constructed at least in part of a piezoelectric material that generates a voltage in response to sound waves impinging against and deforming the diaphragm. The voltage generated by the piezoelectric material is at least equal to the gate drive voltage of the active switching elements, and the voice coil generates a voltage that is less than the gate drive voltage. The voltage generated by the piezoelectric material is used to the active switching elements of the rectifier, while the lower voltage generated by the voice coil is rectified and provided to one or more electrical loads.

The following description is merely exemplary in nature and is not intended to limit the present disclosure, application, or uses.

Figure 1:
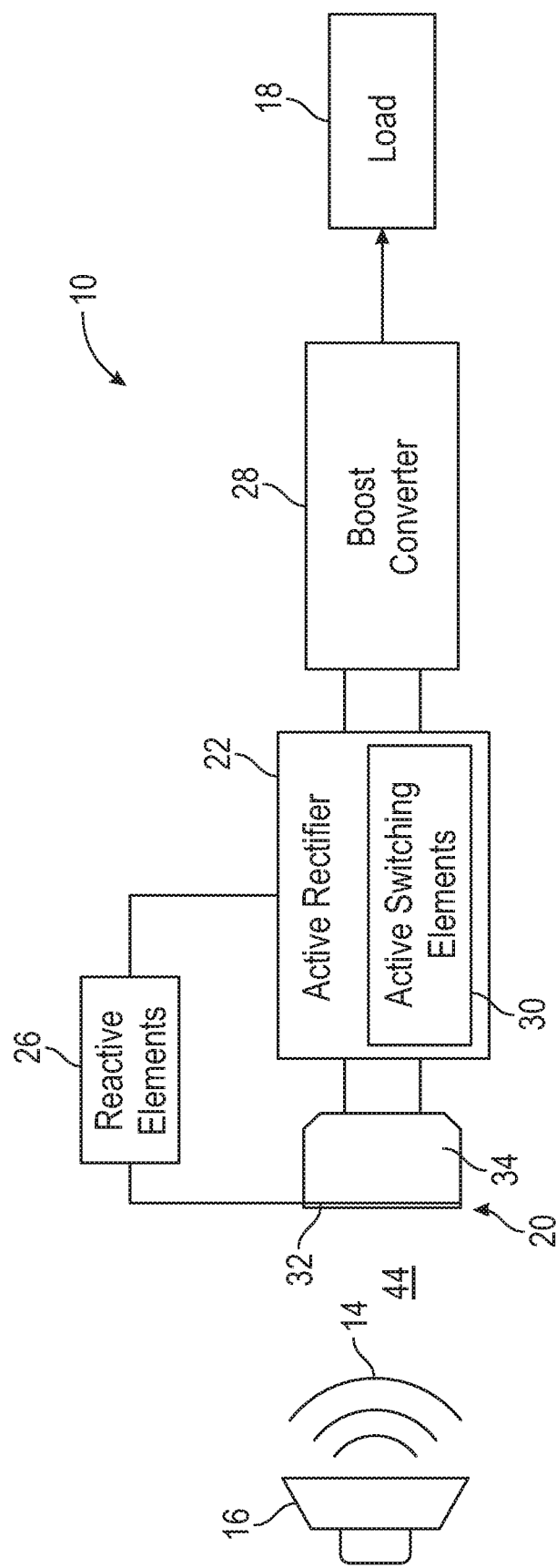
FIG. 1 is a schematic diagram of the disclosed energy harvesting circuit comprising a rectifier having one or more active switching elements and a hybrid acoustic absorber, according to an exemplary embodiment.

Referring to FIG. 1, a schematic diagram of the disclosed energy harvesting circuit 10 is shown. The disclosed energy harvesting circuit 10 is configured to convert sound waves 14 generated by an acoustic source 16 into direct current (DC) power, where the DC power is provided to one or more electrical loads 18. The energy harvesting circuit comprises a hybrid acoustic absorber 20, a rectifier 22, one or more reactive elements 26, and a boost converter 28. The hybrid acoustic absorber 20 is configured to generate alternative current (AC) voltage in response to experiencing vibration caused by the sound waves 14. The rectifier 22 is sometimes referred to as an active rectifier and comprises one or more active switching elements 30 that are each driven by a corresponding gate drive voltage. The hybrid acoustic absorber 20 comprises a diaphragm 32 and a voice coil 34. As explained below, the diaphragm 32 generates a voltage that is at least equal to the gate drive voltage of the active switching elements 30 to actively drive the rectifier 22, while the voice coil 34 generates a voltage that is less than the gate drive voltage of the active switching elements 30.

In one embodiment, the acoustic source 16 comprises one or more sources of unwanted sound, which is referred to as noise. In one embodiment, the acoustic source 16 is one of the following: a jet engine of an aircraft, a high-speed train, a power plant, a machine, or an expressway for vehicles. The sound generated by the acoustic source 16 is represented by the sound waves 14. The sound waves 14 propagate away from the acoustic source 16 and travel through a medium 44, such as air, towards the hybrid acoustic absorber 20. In one example, the energy harvesting circuit 10 can be located on a wing of the aircraft or on any other component of the aircraft that is within a defined distance from the jet engine(s). In another example, energy harvesting circuit 10 can be part of most any electrical system that is located within a defined distance from the aircraft.

Continuing to refer to FIG. 1, the active switching elements 30 of the active rectifier 22 are any electrical component that require power to operate, versus passive components that do not require power. Each active switching element 30 is either a charge-controlled semiconductor or a voltage-controlled semiconductor that is driven into conduction, synchronous with a voltage polarity of the voice coil 34. In an embodiment, the active switching elements 30 are metal-oxide-semiconductor field-effect transistors (MOSFET). For example, a single MOSFET may be used for half wave rectification, while a plurality of MOSFETs (p- and/or n-channel) may be used for full wave rectification.

Figure 2:
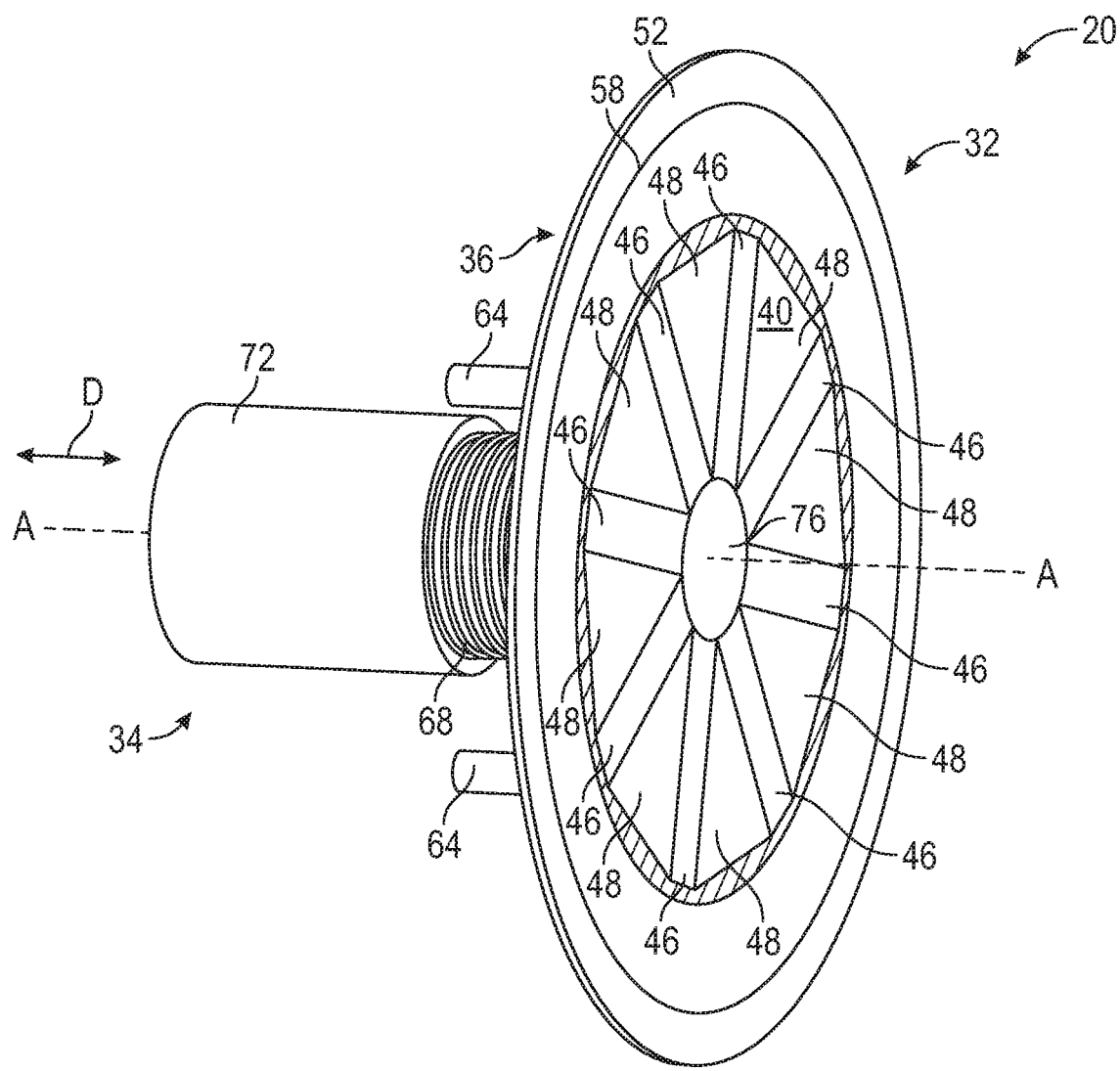
FIG. 2 is a front perspective view of a diaphragm and a voice coil that are part of the hybrid acoustic absorber shown in FIG. 1, according to an exemplary embodiment.
Figure 3:
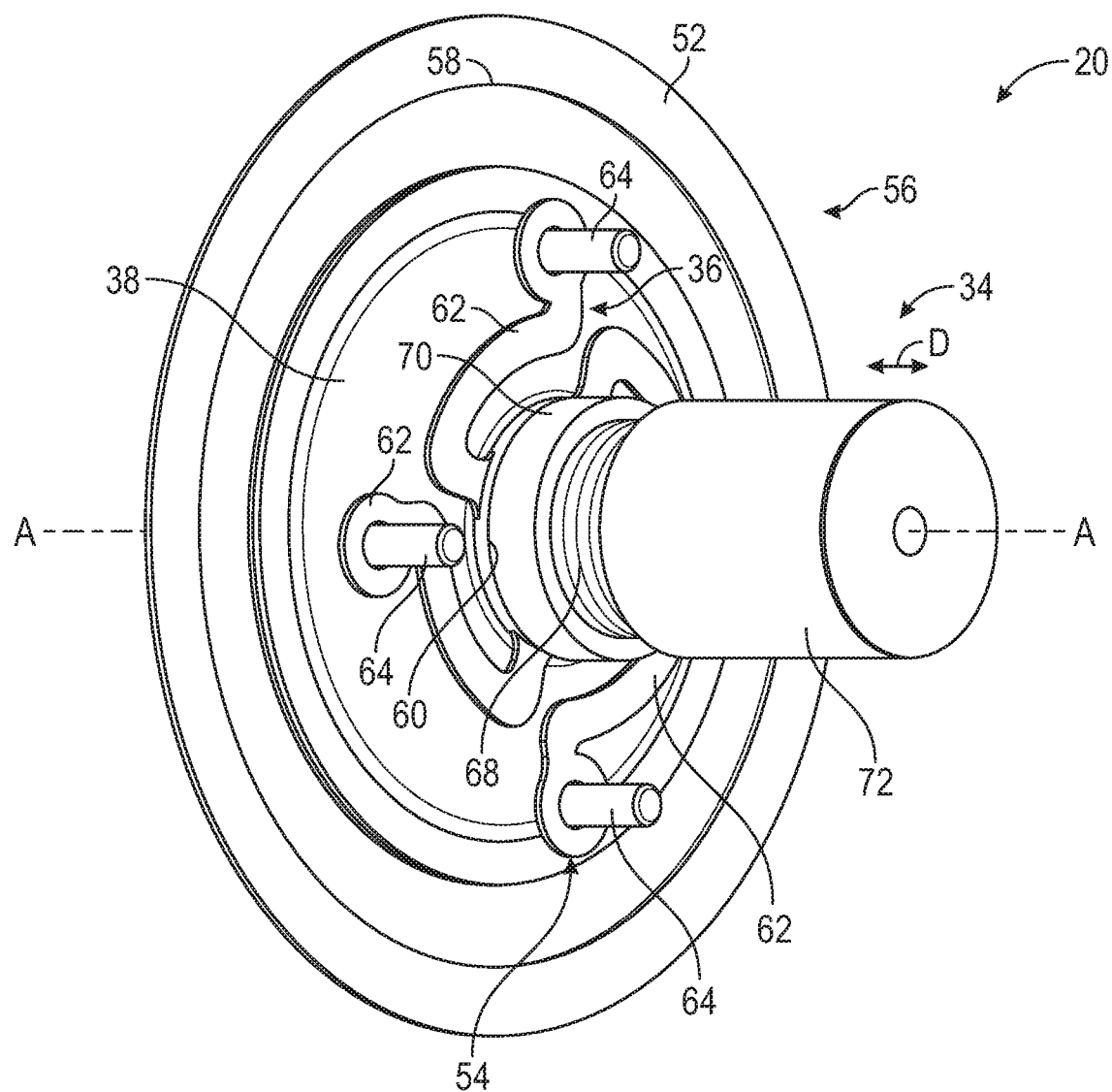
FIG. 3 is a rear perspective view of the diaphragm and the voice coil shown in FIG. 1, according to an exemplary embodiment.

FIGS. 2 and 3 illustrate the hybrid acoustic absorber 20, where FIG. 2 is a front view and FIG. 3 is a rear view of the hybrid acoustic absorber 20. The hybrid acoustic absorber 20 incudes the diaphragm 32, the voice coil 34, a suspension 36, and a basket 38. The diaphragm 32 comprises an annular body 40 and is constructed at least in part of a piezoelectric material 46, and a remaining portion 48 of the diaphragm 32 is constructed of a membrane material. Some examples of the membrane material include, but are not limited to, a plastic material such as polypropylene, fiber reinforced plastic, copper, aluminum, polylactide (PLA), or acrylonitrile butadiene styrene (ABS). The suspension 36 of the hybrid acoustic absorber 20 comprises a peripheral or surround 52 and a damper 54. The damper 54 is sometimes referred to as a spider and is installed on a back side 56 of the hybrid acoustic absorber 20. The surround 52 of the suspension 36 extends around an outer periphery 58 of the diaphragm 32. Referring specifically to FIG. 3, the damper 54 comprises an opening 60 and a plurality of legs 62 that extend radially outward from the opening 60. The opening of the damper 54 is shaped to receive the voice coil 34, and the plurality of legs 62 of the damper 54 are each attached to the basket 38 by a fastener 64.

Referring to FIGS. 1 and 2, the sound waves 14 propagate away from the acoustic source 16, towards the hybrid acoustic absorber 20, and impinge upon the piezoelectric material 46 of the diaphragm 32. The sound waves 14 impart a force upon the diaphragm 32, thereby causing the piezoelectric material 46 to deform. The sound waves 14 also impinge upon the remaining portion 48 of the diaphragm 32, thereby causing the diaphragm 32 to deform and translate back and forth in a linear direction D along an axis of symmetry A-A of the hybrid acoustic absorber 20. The piezoelectric material 46 is configured to generate a diaphragm voltage in response to the sound waves 14 deforming the diaphragm 32. The diaphragm voltage is at least equal to the gate drive voltage of the one or more active switching elements 30 of the rectifier 22. Accordingly, the piezoelectric material 46 is configured to drive active rectification and causes the active switching elements 30 to conduct.

Figure 4:
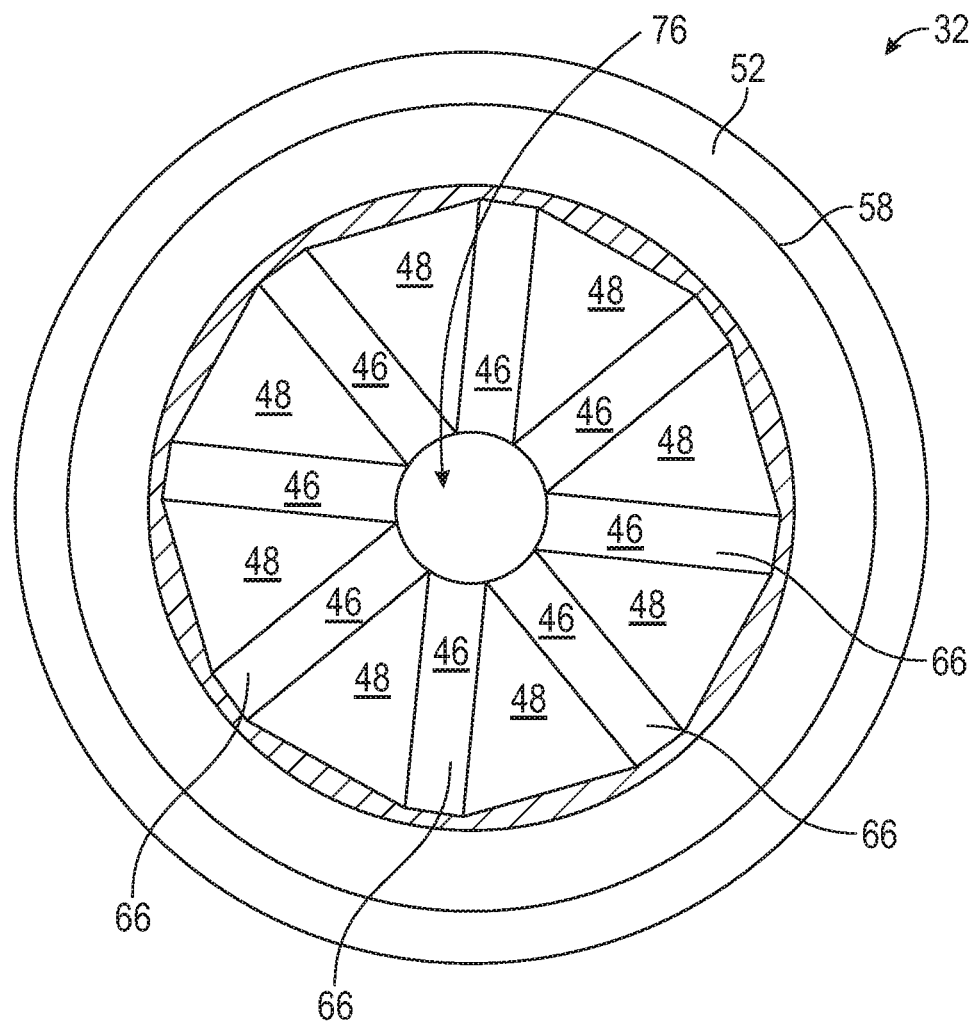
FIG. 4 is a front view of the diaphragm, according to an exemplary embodiment.

FIG. 4 is a front view of an exemplary diaphragm 32 where the piezoelectric material 46 comprises a plurality of piezoelectric rods 66. In the non-limiting embodiment as shown, the piezoelectric rods 66 are arranged in a star-shaped configuration. That is, the piezoelectric rods 66 each extend radially outward with respect to a central portion 76 of the annular body 40 of the diaphragm 32. In one non-limiting embodiment, the piezoelectric rods 66 are constructed of macro fiber composite (MFC), however, it is to be appreciated that other piezoelectric materials may be used as well. In another embodiment, the plurality of piezoelectric rods 66 are each comprised of a single crystal piezoelectric material.

Figure 5:
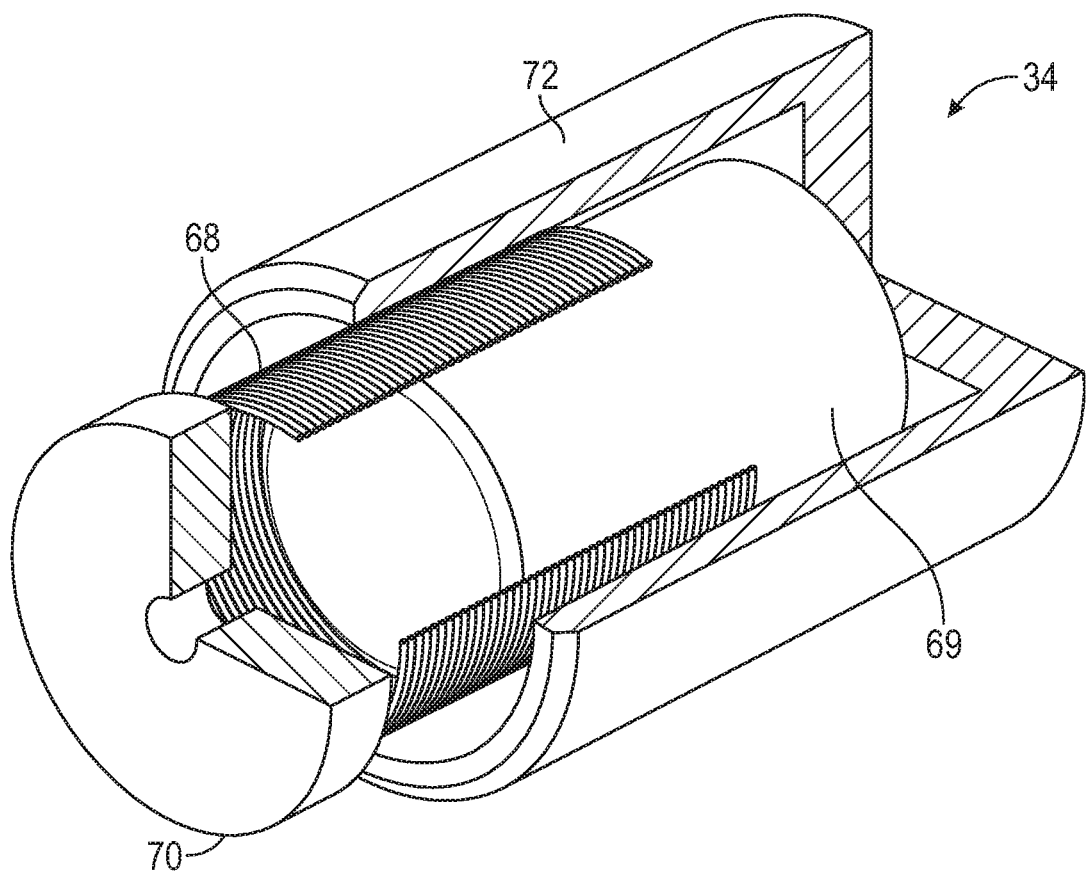
FIG. 5 is a perspective, partially sectioned view of the voice coil, according to an exemplary embodiment.
Figure 6:
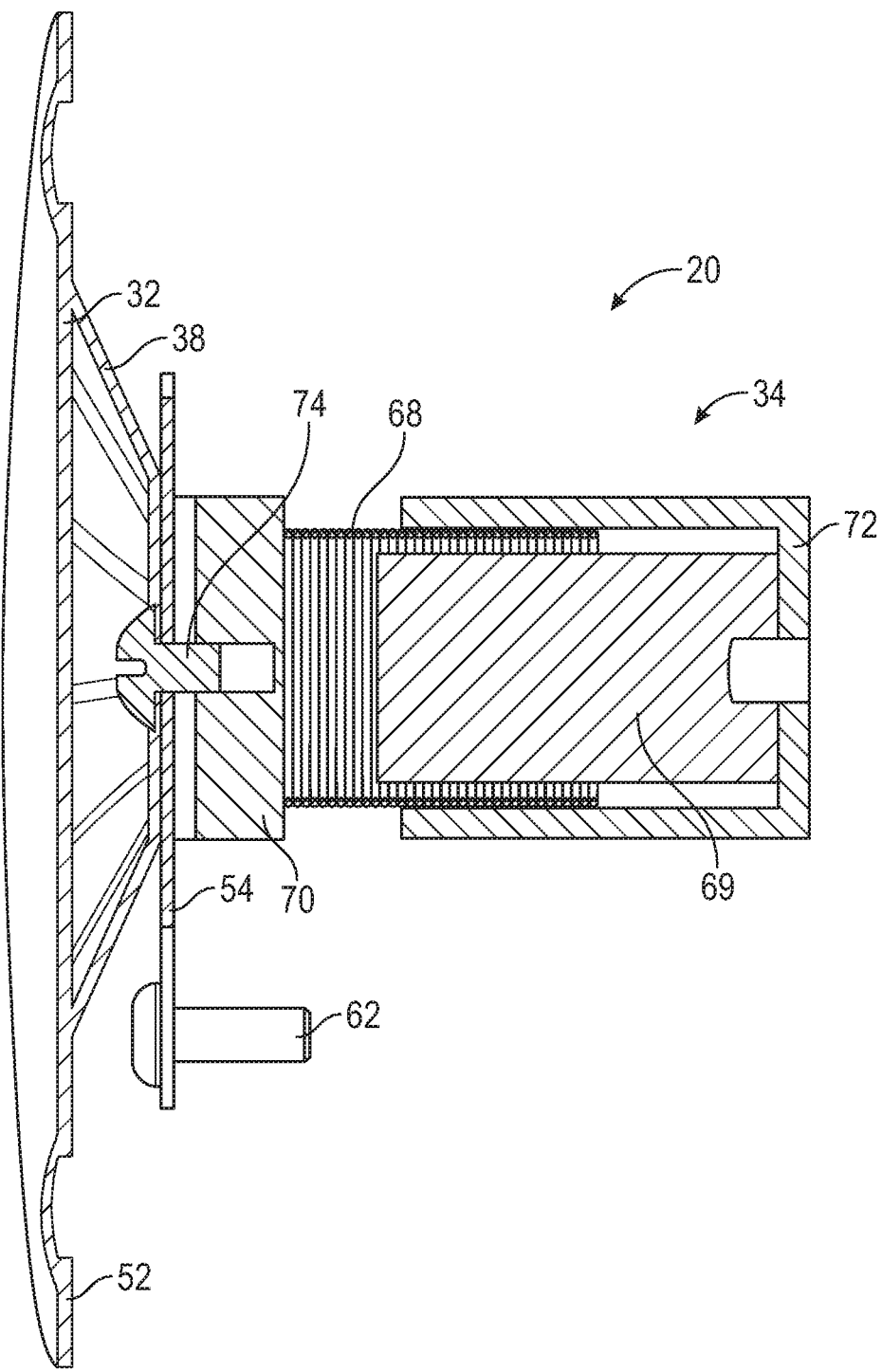
FIG. 6 is a cross-sectioned view of the hybrid acoustic absorber, according to an exemplary embodiment.

FIG. 5 is a partially sectioned view of the voice coil 34 seen in FIG. 4. Referring to FIGS. 4 and 5, the voice coil 34 comprises a wire 68 that is wound around a permanent magnet 69, an end piece 70, and a cover 72. The wire 68 is constructed of a conductive material such as, for example, copper, and is wound around the permanent magnet 69 in a helix configuration. In the non-limiting embodiment as shown in the figures, the permanent magnet 69 and the cover 72 are both comprise a cylindrical profile. The cover 72 contains the permanent magnet 69 and a portion of the wire 68. FIG. 6 is a cross-sectioned view of the hybrid acoustic absorber 20. Referring to FIG. 6, the end piece 70 of the voice coil 34 is attached to the diaphragm 32 by a fastener 74.

Referring to FIGS. 1, 2, 5, and 6, the voice coil 34 is attached to the diaphragm 32. Therefore, when the sound waves 14 (FIG. 1) impinge upon and cause the diaphragm 32 to translate back and forth in the linear direction D (FIG. 2), the wire 68 of the voice coil 34 moves in concert with the diaphragm 32. Relative motion between the wire 68 and the permanent magnet 69 of the voice coil 34 generates a voice coil voltage. Thus, the voice coil 34 is configured to generate the voice coil voltage. The voice coil voltage is less than the gate drive voltage of the one or more active switching elements 30 (FIG. 1). Therefore, the voice coil voltage is not sufficient to cause the active switching elements 30 to conduct. The diaphragm voltage and the voice coil voltage generated by the hybrid acoustic absorber 20 are both AC output. The voice coil voltage generated by relative motion between the wire 68 and the permanent magnet 69 is converted from an AC output into a DC output by the rectifier 22. The rectified voice coil voltage, which is now a DC output, is then sent to the boost converter 28.

Referring back to FIG. 1, the boost converter 28 is a DC to DC converter configured to increase the rectified voice coil voltage, which now comprises a DC output, to a level that is useable by the load 18. The load 18 is any electrical device that consumes relatively modest amounts of electrical power such as, but not limited to, wireless sensors. For example, in one embodiment, the load 18 consumes power at 3.3 Volts or 5 Volts. However, other values may be used as well. The boost converter 28 is electrically coupled to the rectifier 22. The voice coil voltage, which comprises of a DC output, is provided as input to the boost converter 28, and the output of the boost converter 28 is used to power the loads 18.

Referring to FIGS. 1, 3, and 4, in an embodiment the acoustic source 16 generates a broad spectrum of sound energy that comprises relatively low frequencies that are below 500 Hertz as well as relatively high frequencies that are above 500 Hertz. The voice coil 34 of the hybrid acoustic absorber 20 is tuned to harvest energy from the lower frequencies (e.g., less than 500 Hertz), while the diaphragm 32 is tuned to harvest energy from the higher frequencies (e.g., more than 500 Hertz). The voice coil 34 comprises a resonant frequency of less than 500 Hertz, and the diaphragm 32 comprises a resonant frequency of at least 500 Hertz. The resonant frequency of the diaphragm 32 is based on a stiffness of the diaphragm 32 and a moving mass of the diaphragm 32. The moving mass of the diaphragm 32 is equal to a sum of a mass of the diaphragm 32, a mass of the wound wire 68 of the voice coil 34, and an associated air mass. The resonant frequency of the voice coil 34 is based on the stiffness of the surround 52 of the suspension 36, the stiffness of the diaphragm 32, the mass of the diaphragm 32, the mass of the wound wire 68 of the voice coil 34, and the associated air mass. It is also to be appreciated that the stiffness of the diaphragm 32 and the surround 52 are affected by any air that may be contained within the hybrid acoustic absorber 20. Specifically, in one example, the hybrid acoustic absorber 20 may be enclosed inside a container. As a result, a volume of air would be located within the container, which would modify the resonance and the stiffness of both the diaphragm 32 and the surround 52.

Figure 7A:
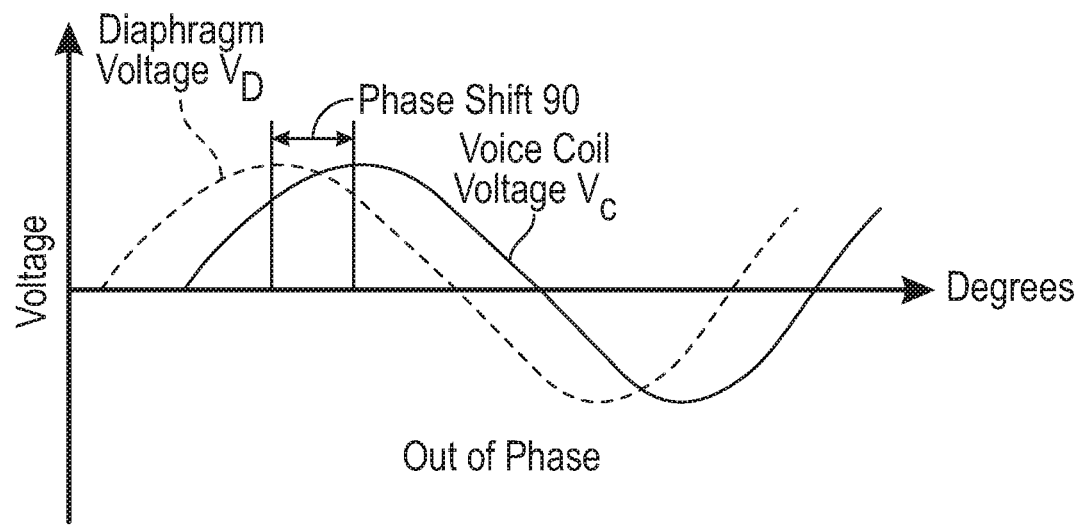
FIG. 7A is a graph illustrating a diaphragm voltage that is out of phase with respect to a voice coil voltage, according to an exemplary embodiment.
Figure 7B:
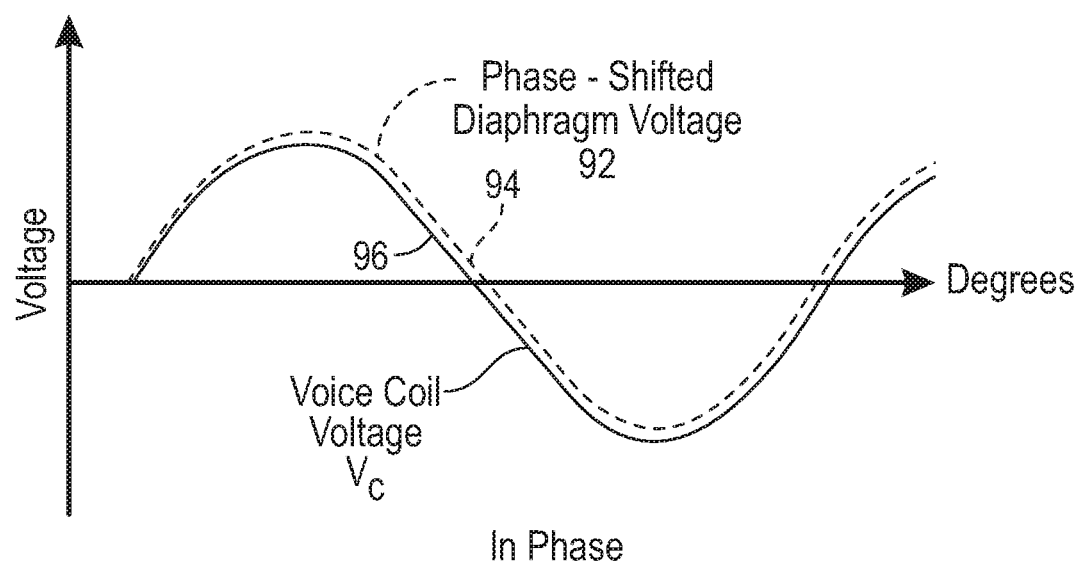
FIG. 7B is a graph illustrating the diaphragm voltage in phase with the voice coil voltage, according to an exemplary embodiment.

Referring to FIG. 1, the one or more reactive elements 26 are electrical components that resist either a change in voltage or current. Some examples of reactive elements 26 comprise, for example, a capacitor and an inductor. An inductor is configured to provide a leading frequency-dependent phase shift of up to ninety degrees, and a capacitor is configured to provide a lagging frequency-dependent phase shift of up to ninety degrees. Referring now to FIG. 7A, in one example, the diaphragm voltage $V_D$ is out of phase with the voice coil voltage $V_C$. Specifically, the diaphragm voltage $V_D$ lags the voice coil voltage $V_C$. Accordingly, the reactive element 26 comprises an inductor for providing a leading frequency-dependent phase shift 90 to the diaphragm voltage $V_D$. As seen in FIG. 7B, the frequency-dependent phase shift 90 is provided to the diaphragm voltage $V_D$ to create a phase-shifted diaphragm voltage 92. As seen in FIG. 7B, a first waveform 94 of the phase-shifted diaphragm voltage 92 and a second waveform 96 of the voice coil voltage $V_C$ are in phase with one another.

Figure 8:
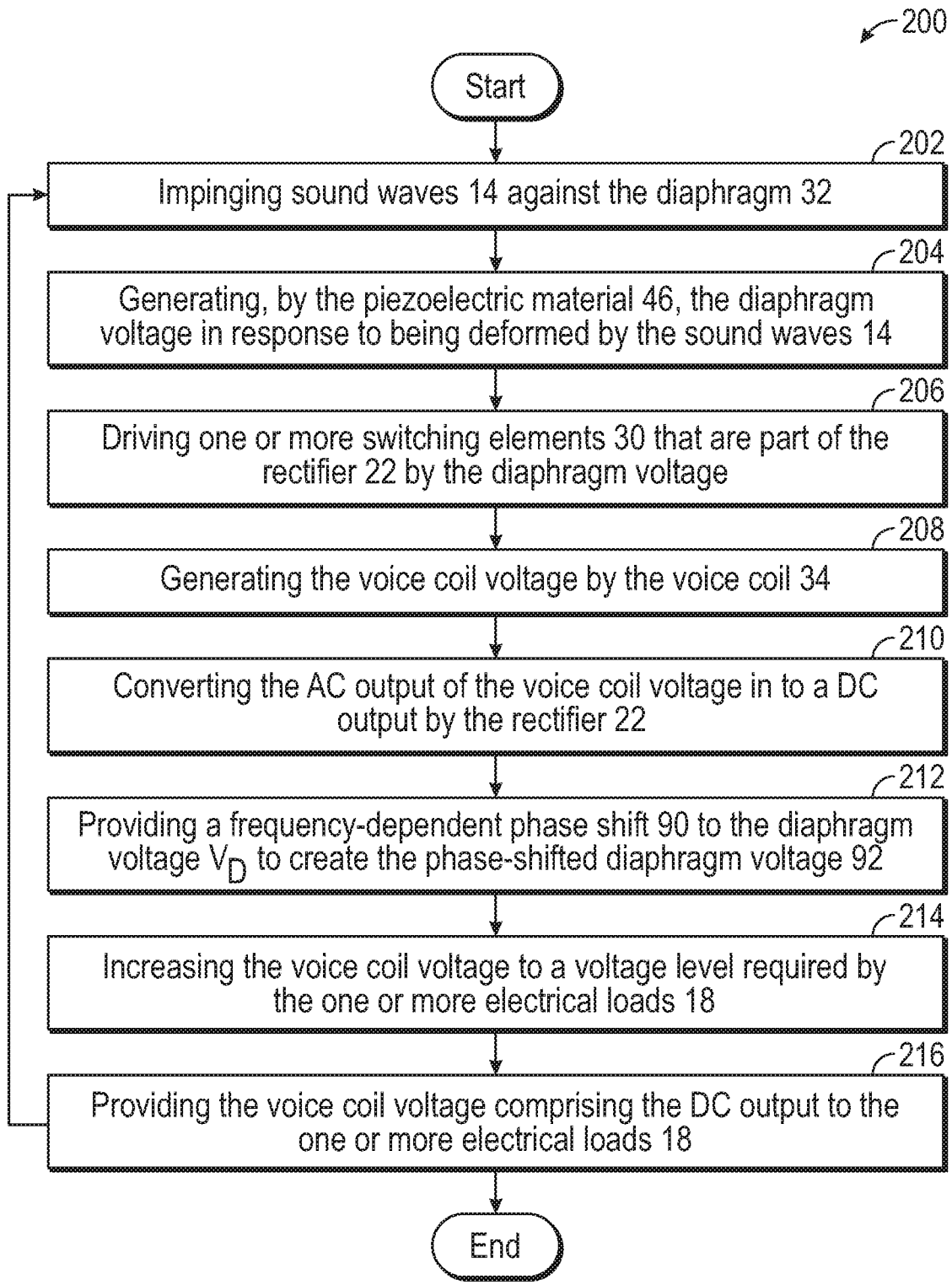
FIG. 8 is a process flow diagram illustrating a method for converting sound waves into electrical power by the disclosed energy harvesting circuit, according to an exemplary embodiment.

FIG. 8 is an exemplary process flow diagram illustrating a method 200 for converting the sound waves 14 into electrical power. Referring generally to FIGS. 1-7, the method 200 begins at block 202. In block 202, the sound waves 14 (FIG. 1) impinge against the diaphragm 32, which results in deformation of the diaphragm 32. The method 200 can then proceed to block 204.

In block 204, the piezoelectric material 46 generates the diaphragm voltage in response to being deformed by the sound waves 14. As mentioned above, the diaphragm 32 is constructed at least in part of the piezoelectric material 46. The method 200 can then proceed to block 206.

In block 206, the one or more active switching elements 30 (FIG. 1) that are part of the rectifier 22 are driven by the diaphragm voltage. As mentioned above, the diaphragm voltage is at least equal to a gate drive voltage of the one or more active switching elements 30 of the rectifier 22. The method 200 can then proceed to block 208.

In block 208, the voice coil voltage is generated by the voice coil 34, which is attached to the diaphragm 32. As mentioned above, the voice coil voltage is less than the gate drive voltage of the one or more active switching elements 30 of the rectifier 22. The method 200 can then proceed to block 210, In block 210, the rectifier 22 converts an AC output of the voice coil voltage into a DC output by the rectifier. The method 200 can then proceed to block 212.

In block 212, the reactive element 26 provides the frequency-dependent phase shift 90 to the diaphragm voltage $V_D$ (FIG. 7A) and creates the phase-shifted diaphragm voltage 92 seen in FIG. 7B. The first waveform 94 of the phase-shifted diaphragm voltage 92 and the second waveform 96 of the voice coil voltage VC are in phase with one another. The method 200 can then proceed to block 214.

In block 214, the boost converter 28 increases the voice coil voltage to a voltage level required by the one or more electrical loads 18. The method 200 can then proceed to block 216.

In block 216, the voice coil voltage comprising the DC output is provided to the one or more electrical loads 18 (FIG. 1). The method 200 can then terminate or, alternatively, return to block 202.

Referring generally to the figures, the disclosed energy harvesting circuit provides various technical effects and benefits. Specifically, the disclosed energy harvesting circuit comprises a diaphragm with a piezoelectric material that generates a diaphragm voltage for driving the active rectifier. It is to be appreciated that driving the active rectifier by a separate diaphragm voltage significantly reduces the AC to DC conversion loss of the voice coil voltage that occurs when employing a passive rectifier. Furthermore, the disclosed energy harvesting circuit also comprises reactive elements that synchronize the diaphragm voltage with the voice coil voltage, which in turn improves energy transfer. Finally, it is to be appreciated that the disclosed energy harvesting circuit provides a greater amount of electrical power at similar sound pressure levels when compared to conventional devices.

Further, the disclosure comprises embodiments according to the following clauses:

Clause 1: an energy harvesting circuit, comprising: one or more electrical loads that consume direct current (DC) power; a rectifier comprising one or more active switching elements, wherein the one or more active switching elements are driven by a gate drive voltage; and a hybrid acoustic absorber, comprising: a diaphragm constructed at least in part of a piezoelectric material, wherein the piezoelectric material is configured to generate a diaphragm voltage in response to sound waves deforming the diaphragm, and wherein the diaphragm voltage is at least equal to the gate drive voltage to drive the one or more active switching elements of the rectifier; and a voice coil attached to the diaphragm and configured to generate a voice coil voltage that is less than the gate drive voltage of the one or more active switching elements, wherein the voice coil voltage comprises an alternating current (AC) output that is converted into a direct current (DC) output by the rectifier, and wherein the voice coil voltage comprising the DC output is provided to the one or more electrical loads.

Clause 2: the energy harvesting circuit of clause 1, wherein the diaphragm comprises a resonant frequency of at least 500 Hertz.

Clause 3: the energy harvesting circuit of any of clauses 1 or 2, wherein the resonant frequency of the diaphragm is based on a stiffness of the diaphragm and a moving mass of the diaphragm.

Clause 4: the energy harvesting circuit of any of clauses 1, 2, or 3, wherein the voice coil comprises a resonant frequency of less than 500 Hertz.

Clause 5: the energy harvesting circuit of any of clauses 1, 2, 3, or 4, wherein the resonant frequency of the voice coil is based on a stiffness of a surround a of a suspension, a stiffness of the diaphragm, a mass of the diaphragm, a mass of a wound wire of the voice coil, and an associated air mass.

Clause 6: the energy harvesting circuit of any of clauses 1, 2, 3, 4, or 5, further comprising a boost converter electrically coupled to the rectifier, wherein the voice coil voltage comprising the DC output is provided as input to the boost converter.

Clause 7: the energy harvesting circuit of any of clauses 1, 2, 3, 4, 5, or 6, wherein the boost converter is configured to increase the voice coil voltage to a voltage level required by the one or more electrical loads.

Clause 8: the energy harvesting circuit of any of clauses 1, 2, 3, 4, 5, or 6, further comprising one or more reactive elements electrically coupled to both the piezoelectric material and the rectifier.

Clause 9: the energy harvesting circuit of any of clauses 1, 2, 3, 4, 5, 6, 7, or 8, wherein the one or more reactive elements provide a frequency-dependent phase shift to the diaphragm voltage to create a phase-shifted diaphragm voltage, and wherein a first waveform of the phase-shifted diaphragm voltage and a second waveform of the voice coil voltage are in phase with one another.

Clause 10: the energy harvesting circuit of any of clauses 1, 2, 3, 4, 5, 6, 7, 8, or 9, wherein each active switching element is either a charge-controlled semiconductor or a voltage-controlled semiconductor.

Clause 11: the energy harvesting circuit of any of clauses 1, 2, 3, 4, 5, 6, 7, 8, 9, or 10, wherein the one or more active switching elements are metal-oxide-semiconductor field-effect transistors (MOSFET).

Clause 12: the energy harvesting circuit of any of clauses 1, 2, 3, 4, 5, 6, 7, 8, 9, 10, or 11, wherein the diaphragm comprises an annular body, and wherein the piezoelectric material comprises a plurality of piezoelectric rods.

Clause 13: the energy harvesting circuit of any of clauses 1, 2, 3, 4, 5, 6, 7, 8, 9, 10, 11, or 12, wherein the plurality of piezoelectric rods are arranged to extend radially outward with respect to a central portion of the annular body of the diaphragm.

Clause 14: the energy harvesting circuit of any of clauses 1, 2, 3, 4, 5, 6, 7, 8, 9, 10, 11, 12, or 13, wherein the plurality of piezoelectric rods are each constructed of a single crystal piezoelectric material or a macro fiber composite (MFC).

Clause 15: the energy harvesting circuit of any of clauses 1, 2, 3, 4, 5, 6, 7, 8, 9, 10, 11, 12, 13, or 14, wherein the voice coil comprises a wire wound around a permanent magnet, wherein relative motion between the wire and the permanent magnet generates the voice coil voltage.

Clause 16: a method, comprising: in response to a diaphragm, constructed at least in part of a piezoelectric material, being deformed by sound waves, generating, by the piezoelectric material, a diaphragm voltage; driving, by the diaphragm voltage, one or more active switching elements that are part of a rectifier of an energy harvesting circuit, wherein the diaphragm voltage is at least equal to a gate drive voltage of the one or more active switching elements of the rectifier; generating a voice coil voltage by a voice coil attached to the diaphragm, wherein the voice coil voltage is less than the gate drive voltage of the one or more active switching elements of the rectifier; converting an alternating current (AC) output of the voice coil voltage into a direct current (DC) output by the rectifier; and providing the voice coil voltage comprising the DC output to one or more electrical loads.

Clause 17: the method of clause 16, wherein the energy harvesting circuit further comprises further one or more reactive elements electrically coupled to both the piezoelectric material and the rectifier.

Clause 18: the method of any of clauses 16 or 17, further comprising: providing, by the one or more reactive elements, a frequency-dependent phase shift to the diaphragm voltage to create a phase-shifted diaphragm voltage, wherein a first waveform of the phase-shifted diaphragm voltage and a second waveform of the voice coil voltage are in phase with one another.

Clause 19: the method of any of clauses 16, 17, or 18, wherein the energy harvesting circuit further comprises a boost converter electrically coupled to the rectifier, and wherein the method further comprises: increasing, by the boost converter, the voice coil voltage to a voltage level required by the one or more electrical loads.

Clause 20: the method of any of clauses 16, 17, 18, or 19, wherein the sound waves are generated by an acoustic source, and wherein the acoustic source is one of the following: a jet engine of an aircraft, a high-speed train, a power plant, a machine, and an expressway for vehicles.

The description of the present disclosure is merely exemplary in nature and variations that do not depart from the gist of the present disclosure are intended to be within the scope of the present disclosure. Such variations are not to be regarded as a departure from the spirit and scope of the present disclosure.

What is claimed is:

1. An energy harvesting circuit, comprising:
   one or more electrical loads that consume direct current (DC) power;
   a rectifier comprising one or more active switching elements, wherein the one or more active switching elements are driven by a gate drive voltage; and
   a hybrid acoustic absorber, comprising:
      a diaphragm constructed at least in part of a piezoelectric material, wherein the piezoelectric material is configured to generate a diaphragm voltage in response to sound waves deforming the diaphragm, and wherein the diaphragm voltage is at least equal to the gate drive voltage to drive the one or more active switching elements of the rectifier; and a voice coil attached to the diaphragm and configured to generate a voice coil voltage that is less than the gate drive voltage of the one or more active switching elements, wherein the voice coil voltage comprises an alternating current (AC) output that is converted into a DC output by the rectifier, and wherein the DC output is provided to the one or more electrical loads.

2. The energy harvesting circuit of claim 1, wherein the diaphragm comprises a resonant frequency of at least 500 Hertz.

3. The energy harvesting circuit of claim 2, wherein the resonant frequency of the diaphragm is based on a stiffness of the diaphragm and a moving mass of the diaphragm.

4. The energy harvesting circuit of claim 1, wherein the voice coil comprises a resonant frequency of less than 500 Hertz.

5. The energy harvesting circuit of claim 4, wherein the resonant frequency of the voice coil is based on a stiffness of a surround of a suspension, a stiffness of the diaphragm, a mass of the diaphragm, a mass of a wound wire of the voice coil, and an associated air mass.

6. The energy harvesting circuit of claim 1, further comprising a boost converter electrically coupled to the rectifier, wherein the DC output is provided as input to the boost converter.

7. The energy harvesting circuit of claim 6, wherein the boost converter is configured to increase the voice coil voltage to a voltage level required by the one or more electrical loads.

8. The energy harvesting circuit of claim 1, further comprising one or more reactive elements electrically coupled to both the piezoelectric material and the rectifier.

9. The energy harvesting circuit of claim 8, wherein the one or more reactive elements provide a frequency-dependent phase shift to the diaphragm voltage to create a phase-shifted diaphragm voltage, and wherein a first waveform of the phase-shifted diaphragm voltage and a second waveform of the voice coil voltage are in phase with one another.

10. The energy harvesting circuit of claim 1, wherein each active switching element of the one or more active switching elements is either a charge-controlled semiconductor or a voltage-controlled semiconductor.

11. The energy harvesting circuit of claim 1, wherein the one or more active switching elements are metal-oxide-semiconductor field-effect transistors (MOSFET).

12. The energy harvesting circuit of claim 1, wherein the diaphragm comprises an annular body, and wherein the piezoelectric material comprises a plurality of piezoelectric rods.

13. The energy harvesting circuit of claim 12, wherein the plurality of piezoelectric rods are arranged to extend radially outward with respect to a central portion of the annular body of the diaphragm.

14. The energy harvesting circuit of claim 12, wherein the plurality of piezoelectric rods are each constructed of a single crystal piezoelectric material or a macro fiber composite (MFC).

15. The energy harvesting circuit of claim 1, wherein the voice coil comprises a wire wound around a permanent magnet, wherein relative motion between the wire and the permanent magnet generates the voice coil voltage.

16. A method, comprising:
in response to a diaphragm, constructed at least in part of a piezoelectric material, being deformed by sound waves, generating, by the piezoelectric material, a diaphragm voltage;

driving, by the diaphragm voltage, one or more active switching elements that are part of a rectifier of an energy harvesting circuit, wherein the diaphragm voltage is at least equal to a gate drive voltage of the one or more active switching elements of the rectifier;

generating a voice coil voltage by a voice coil attached to the diaphragm, wherein the voice coil voltage is less than the gate drive voltage of the one or more active switching elements of the rectifier;

converting an alternating current (AC) output of the voice coil voltage into a direct current (DC) output by the rectifier; and providing the DC output to one or more electrical loads.

17. The method of claim 16, wherein the energy harvesting circuit further comprises one or more reactive elements electrically coupled to both the piezoelectric material and the rectifier.

18. The method of claim 17, further comprising:
providing, by the one or more reactive elements, a frequency-dependent phase shift to the diaphragm voltage to create a phase-shifted diaphragm voltage, wherein a first waveform of the phase-shifted diaphragm voltage and a second waveform of the voice coil voltage are in phase with one another.

19. The method of claim 16, wherein the energy harvesting circuit further comprises a boost converter electrically coupled to the rectifier, and wherein the method further comprises:
increasing, by the boost converter, the voice coil voltage to a voltage level required by the one or more electrical loads.

20. The method of claim 16, wherein the sound waves are generated by an acoustic source, and wherein the acoustic source is one of the following: a jet engine of an aircraft, a high-speed train, a power plant, a machine, and an expressway for vehicles.

* * * * *